(12) United States Patent
Gambino et al.

(10) Patent No.: US 8,753,917 B2
(45) Date of Patent: Jun. 17, 2014

(54) METHOD OF FABRICATING PHOTOCONDUCTOR-ON-ACTIVE PIXEL DEVICE

(75) Inventors: Jeffrey P. Gambino, Westford, VT (US); Robert K. Leidy, Burlington, VT (US); Richard J. Rassel, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 113 days.

(21) Appl. No.: 12/967,625

(22) Filed: Dec. 14, 2010

(65) Prior Publication Data

US 2012/0146115 A1 Jun. 14, 2012

(51) Int. Cl.
 *H01L 31/112* (2006.01)
(52) U.S. Cl.
 USPC 438/98; 438/57; 257/E31.057; 257/E31.053; 257/E31.06; 257/E31.084; 257/E31.085
(58) Field of Classification Search
 USPC .......... 257/291, 292, 444, E31.056, E31.057, 257/331.06, E31.084, E31.085; 438/57, 98
 See application file for complete search history.

(56) References Cited

U.S. PATENT DOCUMENTS

| | | | | |
|---|---|---|---|---|
| 5,936,261 | A * | 8/1999 | Ma et al. | 257/59 |
| 6,791,130 | B2 * | 9/2004 | Chao et al. | 257/233 |
| 6,798,033 | B2 * | 9/2004 | Chao et al. | 257/444 |
| 6,809,358 | B2 | 10/2004 | Hsieh et al. | |
| 6,841,411 | B1 | 1/2005 | Varghese | |
| 6,946,638 | B2 * | 9/2005 | Kuwazawa et al. | 250/208.1 |
| 7,276,749 | B2 * | 10/2007 | Martin et al. | 257/292 |
| 7,285,764 | B2 * | 10/2007 | Kuwazawa et al. | 250/208.1 |
| 7,342,268 | B2 | 3/2008 | Adkisson et al. | |
| 7,411,233 | B2 * | 8/2008 | Chao et al. | 257/292 |
| 7,416,912 | B2 * | 8/2008 | Lee | 438/57 |
| 7,436,038 | B2 * | 10/2008 | Engelmann et al. | 257/444 |
| 7,592,655 | B2 | 9/2009 | Ohkawa et al. | |
| 7,638,799 | B2 * | 12/2009 | Chang et al. | 257/53 |
| 7,649,219 | B2 * | 1/2010 | Kim | 257/292 |
| 7,727,794 | B2 * | 6/2010 | Shibayama | 438/78 |
| 7,791,117 | B2 * | 9/2010 | Zhang et al. | 257/292 |
| 7,883,920 | B2 * | 2/2011 | Hwang | 438/57 |

(Continued)

OTHER PUBLICATIONS

C.J. Bebek et al., "Development of Fully Depleted, Back-Illuminated Charge Coupled Devices," Proceedings of SPIE, SPIE-5499, 2004, pp. 140-150.

(Continued)

*Primary Examiner* — William F Kraig
*Assistant Examiner* — Edward Chin
(74) *Attorney, Agent, or Firm* — Cantor Colburn LLP; Richard Kotulak

(57) ABSTRACT

A design structure embodied in a machine readable medium used in a design process includes a first dielectric layer disposed on an intermediary layer, a first conductive pad portion and a first interconnect portion disposed on the first dielectric layer, a second dielectric layer disposed on the first dielectric layer, a first capping layer disposed on the first interconnect portion and a portion of the first conductive pad portion, a second capping layer disposed on the first capping layer and a portion of the second dielectric layer, an n-type doped silicon layer disposed on the second capping layer and the first conductive pad portion, an intrinsic silicon layer disposed on the n-type doped silicon layer, and a p-type doped silicon layer disposed on the intrinsic silicon layer.

18 Claims, 15 Drawing Sheets

(56) References Cited

U.S. PATENT DOCUMENTS

| | | | |
|---|---|---|---|
| 7,939,359 B2* | 5/2011 | Ohgishi | 438/57 |
| 7,999,292 B2* | 8/2011 | Hwang | 257/292 |
| 8,361,898 B2* | 1/2013 | Wang et al. | 438/612 |
| 2004/0036010 A1 | 2/2004 | Hsieh et al. | |
| 2004/0041930 A1* | 3/2004 | Chao et al. | 348/294 |
| 2008/0036026 A1* | 2/2008 | Park | 257/459 |
| 2008/0042230 A1 | 2/2008 | Miida | |
| 2008/0079102 A1* | 4/2008 | Chen et al. | 257/431 |
| 2008/0185585 A1* | 8/2008 | Roy | 257/48 |
| 2008/0258189 A1* | 10/2008 | Kim | 257/292 |
| 2008/0283887 A1* | 11/2008 | Lee | 257/292 |
| 2008/0303072 A1* | 12/2008 | Lee et al. | 257/292 |
| 2009/0039397 A1* | 2/2009 | Chao | 257/233 |
| 2009/0305499 A1 | 12/2009 | Gambino et al. | |
| 2010/0038689 A1* | 2/2010 | Ahn et al. | 257/292 |
| 2010/0090093 A1* | 4/2010 | Shim | 250/208.1 |
| 2011/0115043 A1* | 5/2011 | Takata | 257/444 |
| 2011/0198615 A1* | 8/2011 | Shushakov et al. | 257/77 |
| 2011/0233620 A1* | 9/2011 | Naruse et al. | 257/225 |
| 2011/0272774 A1* | 11/2011 | Itagaki | 257/437 |
| 2012/0015098 A1* | 1/2012 | Cheng et al. | 427/110 |

OTHER PUBLICATIONS

H. H. Wang et al., "A Novel Structure of a-Si:H Based Photoconductor Stacked on APS Technology," IEEE Conf. on Elec. Dev. & Sol-St Cir., EDSSC, Dec. 20-22, 2007, pp. 201-204.

O. Matsushima et al., "A High-Sensitivity Broadband Image Sensor Using CuInGaSe2 Thin Films," IEEE International Electron Devices Meeting, IEDM Dec. 15-17, 2008, pp. 1-4.

* cited by examiner

METHOD OF FABRICATING PHOTOCONDUCTOR-ON-ACTIVE PIXEL DEVICE

BACKGROUND

The present invention relates to design structures and methods involving fabricating photoconductor-on-active pixel devices and resultant structures.

In this regard, image sensors may be formed using metal oxide semiconductor (MOS) or complimentary metal oxide semiconductor (CMOS) methods. The sensors may include multiple transistors within a pixel and use photo sensing devices and active devices in each pixel cell. The active devices in a cell include transistors that are interconnected by conductive lines.

Forming the photo sensing devices over the active devices in a cell allow the photo sensing devices to be exposed to light without being obstructed by the opaque active devices and interconnects.

BRIEF SUMMARY

According to one embodiment of the present invention, a method for fabricating a photoconductor-on-active pixel device includes depositing a conductive layer on a first dielectric layer, depositing a first capping layer on the conductive layer, removing portions of the conductive layer and the first capping layer to define a first conductive pad portion and a first interconnect portion, and expose portions of the first dielectric layer, depositing a second dielectric layer on the exposed portions of the first dielectric layer, depositing a second capping layer on the first capping layer and the second dielectric layer, removing portions of the second capping layer to expose portions of the second dielectric layer and removing portions of the second capping layer and first capping layer to expose a portion of the first conductive pad portion, and forming radiation absorbing layers on the exposed portions of the second dielectric layer, the exposed portion of the first conductive pad portion, and the second capping layer.

According to another embodiment of the present invention, a photoconductor-on-active pixel device includes a first dielectric layer disposed on an intermediary layer, a first conductive pad portion and a first interconnect portion disposed on the first dielectric layer, a second dielectric layer disposed on the first dielectric layer, a first capping layer disposed on the first interconnect portion and a portion of the first conductive pad portion, a second capping layer disposed on the first capping layer and a portion of the second dielectric layer, an n-type doped silicon layer disposed on the second capping layer and the first conductive pad portion, an intrinsic silicon layer disposed on the n-type doped silicon layer, and a p-type doped silicon layer disposed on the intrinsic silicon layer.

According to yet another embodiment of the present invention, a photoconductor-on-active pixel device includes a first dielectric layer disposed on an intermediary layer, a first capping layer disposed on first dielectric layer, a first conductive pad portion and a first interconnect portion disposed on the first capping layer, a second dielectric layer disposed on the first dielectric layer, an n-type doped silicon layer disposed on the second dielectric layer, the first conductive pad portion, and the first interconnect portion, an intrinsic silicon layer disposed on the n-type doped silicon layer, and a p-type doped silicon layer disposed on the intrinsic silicon layer.

According to yet another embodiment of the present invention, a design structure embodied in a machine readable medium used in a design process includes a first dielectric layer disposed on an intermediary layer, a first conductive pad portion and a first interconnect portion disposed on the first dielectric layer, a second dielectric layer disposed on the first dielectric layer, a first capping layer disposed on the first interconnect portion and a portion of the first conductive pad portion, a second capping layer disposed on the first capping layer and a portion of the second dielectric layer, an n-type doped silicon layer disposed on the second capping layer and the first conductive pad portion, an intrinsic silicon layer disposed on the n-type doped silicon layer, and a p-type doped silicon layer disposed on the intrinsic silicon layer.

According to yet another embodiment of the present invention, a method for fabricating a photoconductor-on-active pixel device includes forming conductive vias in a first dielectric layer, depositing a first capping layer on the vias and the first dielectric layer, depositing a conductive layer on a first capping layer, removing portions of the conductive layer and the first capping layer to define a first conductive pad portion and a first interconnect portion, and expose portions of the first dielectric layer, forming radiation absorbing layers on the exposed portions of the first dielectric layer, the exposed portion of the conductive pad portion, and the first capping layer, and removing a portion of the radiation absorbing layers to expose a portion of the first conductive pad portion.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-8 illustrate side views of an exemplary embodiment of a method for forming a photoconductor-on-active pixel (POAP) device; in which:

FIG. 1 illustrates the formation of a plurality of field effect devices;

FIG. 2 illustrates the formation of conductive vias;

FIG. 3 illustrates the formation of a conductive metallic layer;

FIG. 4 illustrates the formation of a conductive pad region and conductive interconnects;

FIG. 5 illustrates the removal of portions of the dielectric layer;

FIG. 6 illustrates the deposition of a second capping layer;

FIG. 7 illustrates the resultant structure following an etching process; and

FIG. 8 illustrates the resultant structure the formation of a radiation absorbing device.

FIGS. 9-12 illustrate side views of an alternate exemplary method and resultant structure for forming a POAP device; in which:

FIG. 9 illustrates an active device region and an interconnect portion;

FIG. 10 illustrates the formation of a capping layer;

FIG. 11 illustrates the resultant structure following a photolithographic patterning an etching process;

FIG. 12 illustrates the resultant structure following the deposition of a dielectric layer;

DETAILED DESCRIPTION

Figure 1:
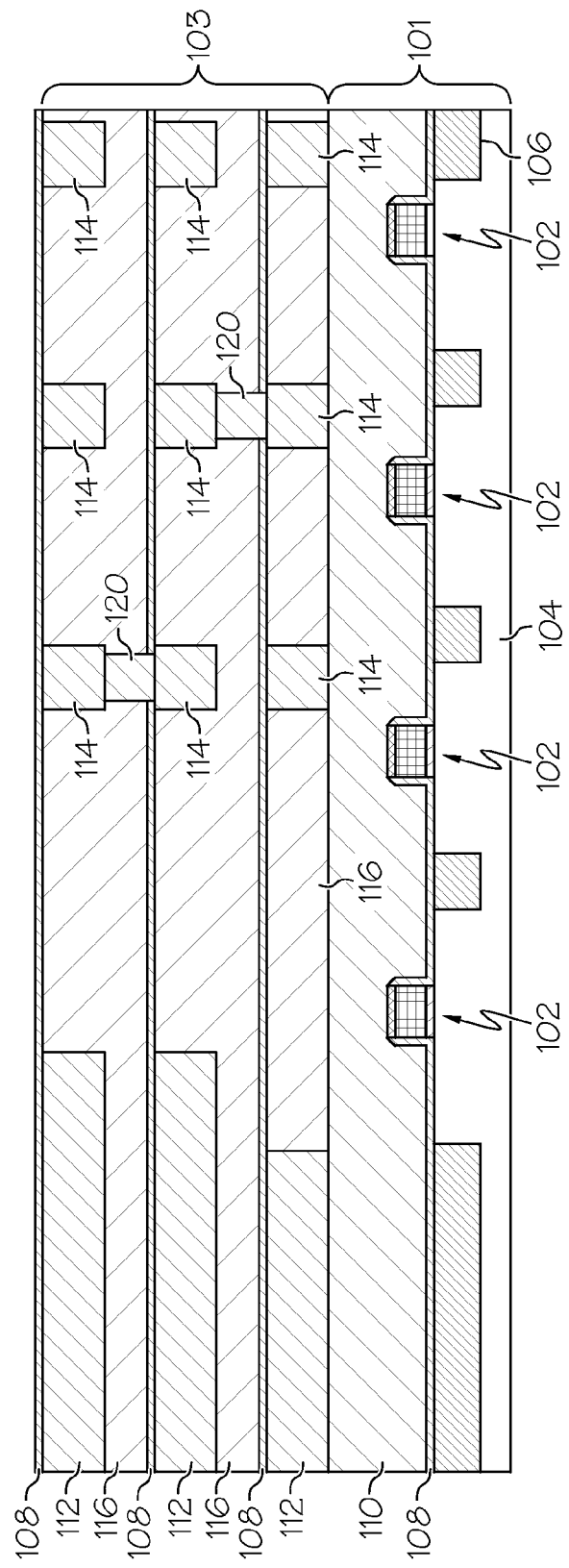

FIGS. 1-8 illustrate an exemplary embodiment of a method for forming a photoconductor-on-active pixel (POAP) device. Referring to FIG. 1, a plurality of field effect devices (FETs) 102 that may include any type of FET are formed on a silicon substrate 104 using, for example, a suitable (MOS or CMOS) fabrication process. The silicon substrate 104 of the illustrated embodiment includes silicon trench isolation regions 106. A capping layer 108 is formed over the substrate 104. The capping layer 108 may be formed from any suitable material such as, for example, a nitride material. A dielectric layer 110 is formed over the FETs 102 and the capping layer 108; resulting in an active device region 101. In the illustrated embodiment the dielectric layer 110 is formed from a boron phosphorous doped glass material, but may be formed from any suitable dielectric material using for example, a chemical vapor deposition (CVD) or a plasma-enhanced chemical vapor deposition (PECVD) process. Following the formation of the dielectric layer 110, a conductive pad 112 and conductive interconnects 114 may be formed using conventional processing. For example, the conductive interconnects 114 may be formed by a process that includes depositing a dielectric layer 116; patterning a trench region in the dielectric layer with a lithographic and reactive ion etching (RIE) process; depositing a conductive metallic material in the trench region and over the dielectric layer 116; and removing excess metallic material using a polishing process such as a chemical mechanical polishing (CMP) process. A capping layer 108, such as SiN or SiCN is formed over the exposed conductive pad 112, conductive interconnects 114, and dielectric layer 116. A dielectric layer 116 is deposited on the exposed dielectric layer 110. The dielectric layer 116 may include, for example, an oxide material such as, SiO2 or SiCOH that is formed using a CVD process. Additional conductive pads 112, conductive interconnects 114 and dielectric layers 116 may be formed in a similar manner as described above to define an interconnect portion 103 of the device. Vias 120 may be formed that connect interconnect layers 112 and 114 where applicable.

Figure 2:
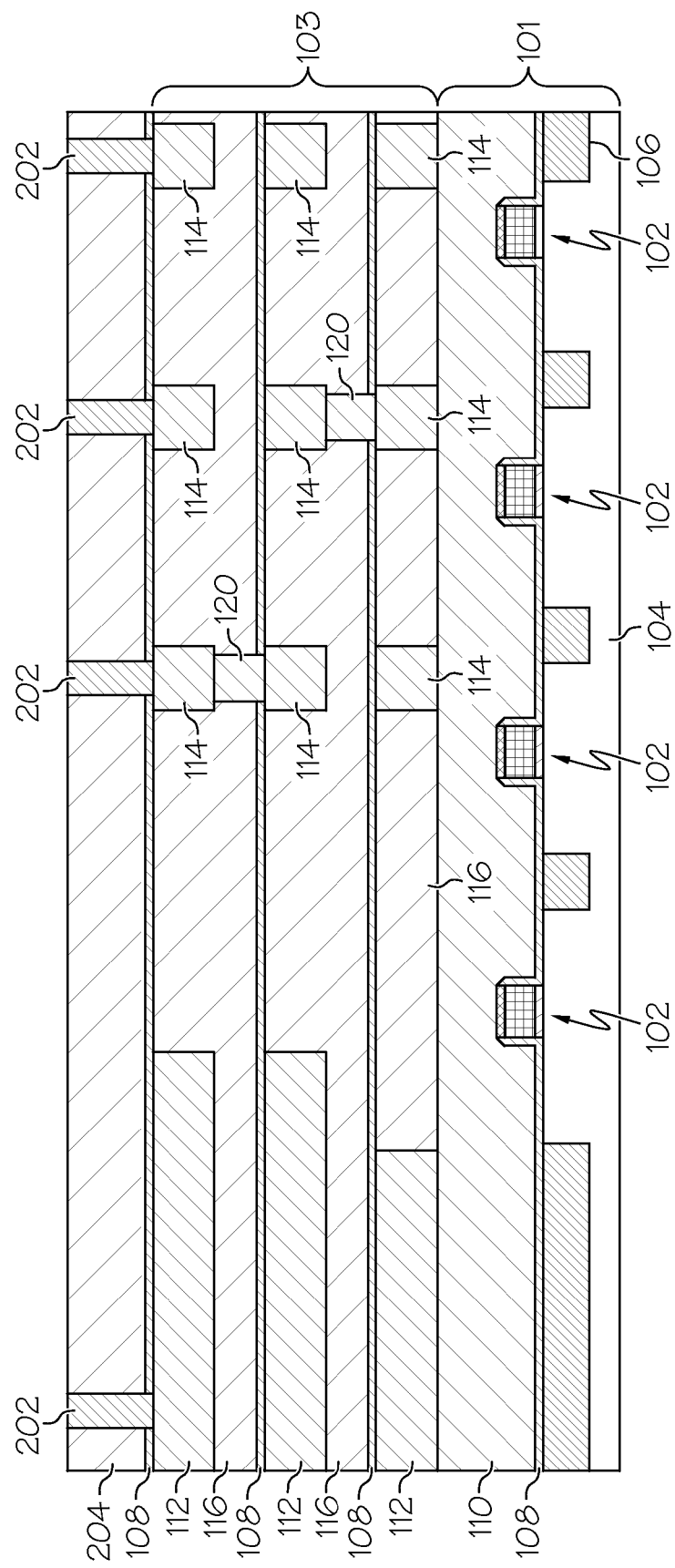

FIG. 2 illustrates the formation of conductive vias 202. In this regard, a dielectric layer 204 that may include, for example, an oxide material such as silicon oxide, is formed on the exposed capping layer 108. Cavities are formed in the dielectric layer 204 and capping layer 108 that define the vias 202 and expose portions of the conductive pad 112 and conductive interconnects 114. A liner layer (not shown) such as, for example TiN, may be formed in the cavities and the cavities are filled with a conductive material such as, for example, tungsten that forms the vias 202. A chemical mechanical polishing process that removes the excess tungsten is performed that electrically isolates the tungsten vias 202.

Figure 3:
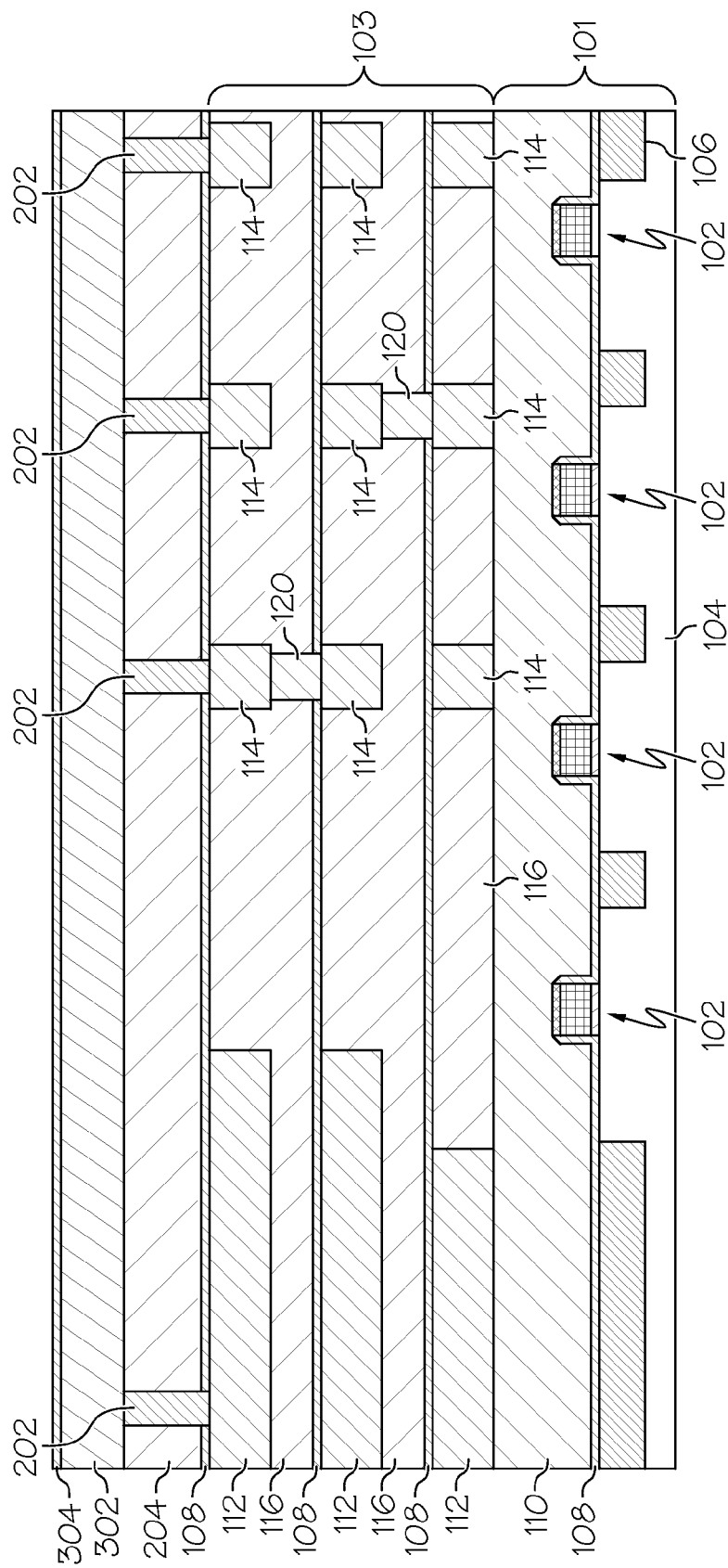

FIG. 3 illustrates the formation of a conductive metallic layer 302 that is formed over the exposed dielectric layer 204 and the vias 202 using, for example, a CVD process. The conductive metallic layer 302 may include, a multi-layered stack of different materials (e.g., Ti/Al/TiN or Ti/TiN/Al/TiN). The Aluminum material may be doped with Cu or Si. A capping layer 304 is formed over the metallic layer 302; the capping layer 304 may include, for example, a nitride material such as titanium nitride; TaN; TiN and Pt; or another suitable material.

Figure 4:
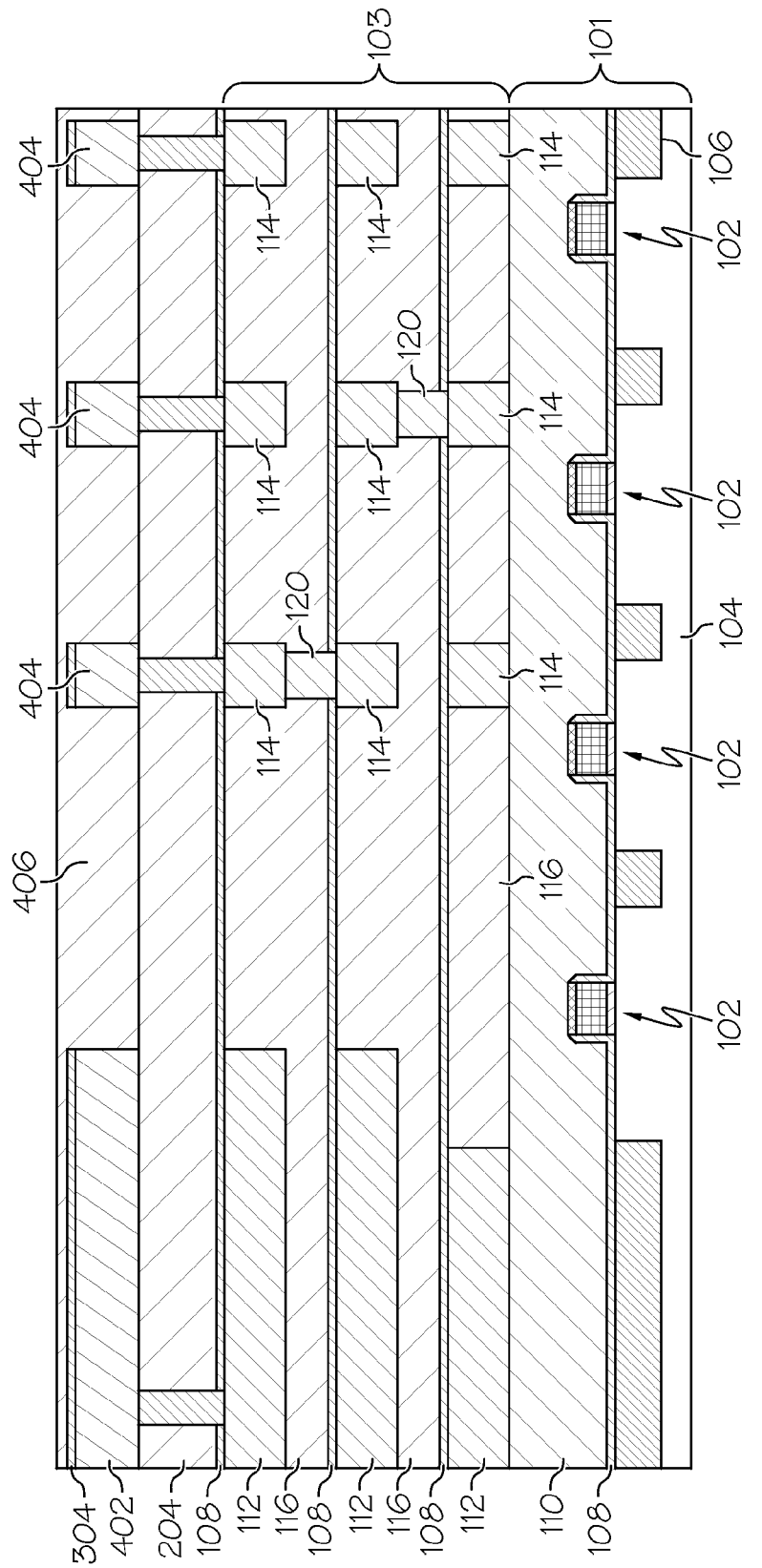

FIG. 4 illustrates the formation of a conductive pad region 402 and conductive interconnects 404 using, for example, a lithographic patterning and etching process that removes portions of the conductive metallic layer 302 and the capping layer 304 (of FIG. 3) to expose portions of the dielectric layer 204, and defines the conductive pad region 402 and conductive interconnects 404. A dielectric layer 406 is formed over the exposed dielectric layer 204 and capping layer 304 using, for example, a CVD process.

Figure 5:
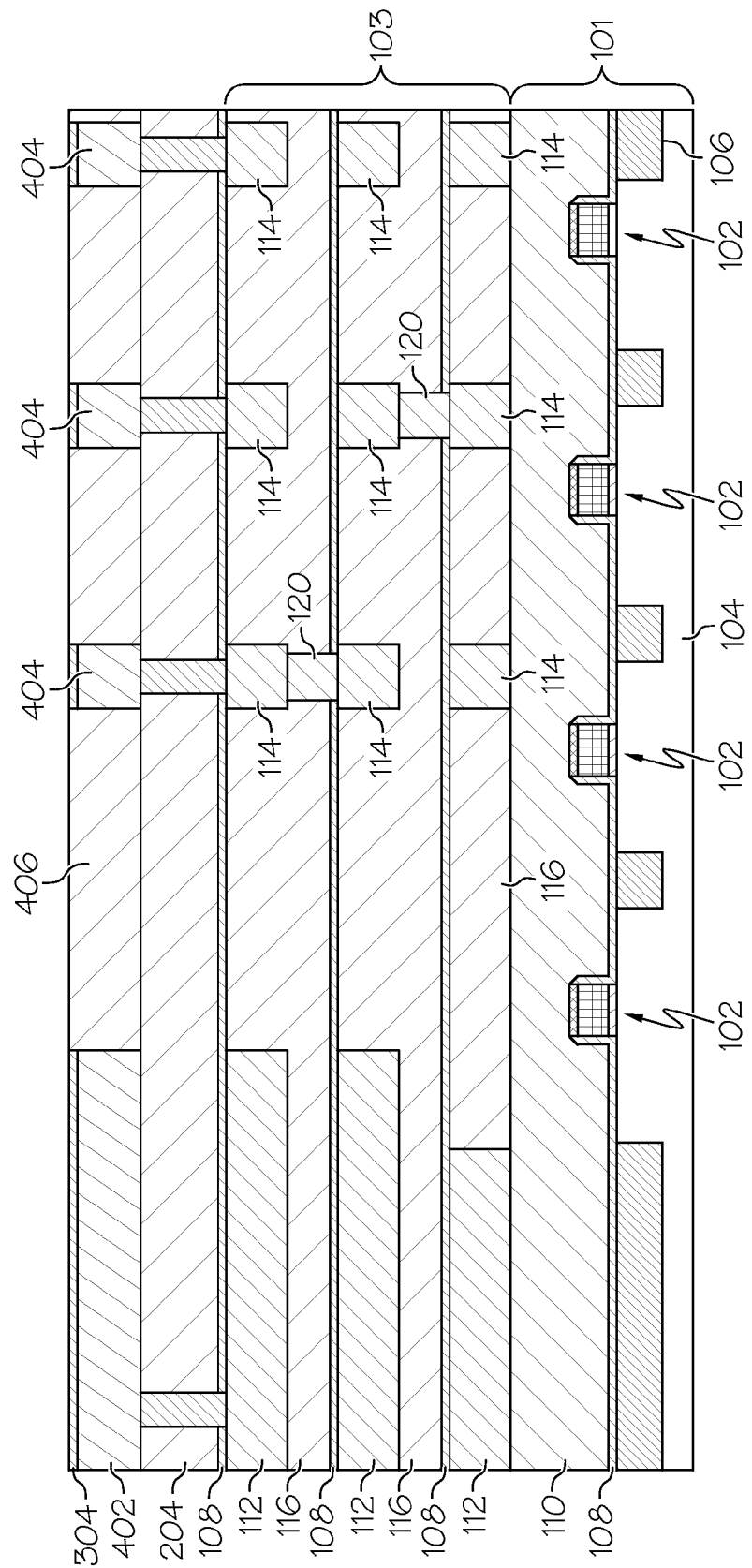

FIG. 5 illustrates the removal of portions of the dielectric layer 406 using a polishing process, such as, for example a chemical mechanical polishing (CMP) process that exposes the capping layer 304.

Figure 6:
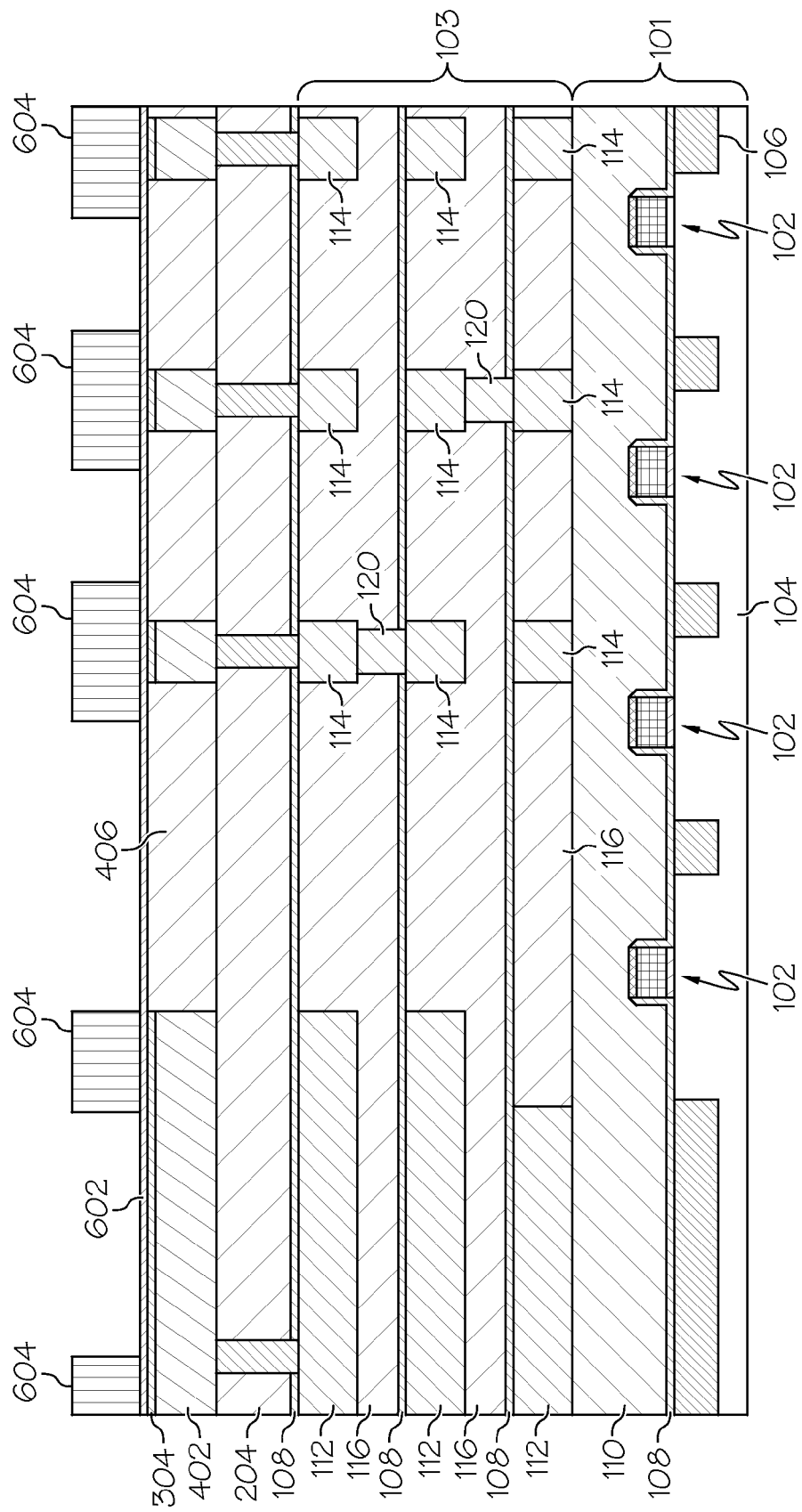

FIG. 6 illustrates the deposition of a second capping layer 602 that is deposited over the exposed capping layer 304 and dielectric layer 406, the second capping layer 602 may include, for example a nitride material such as titanium nitride; TaN; TiN and Pt; or another suitable material. Following the deposition of the second capping layer 602 a photoresist 604 is patterned over portions of the second capping layer 602.

Figure 7:
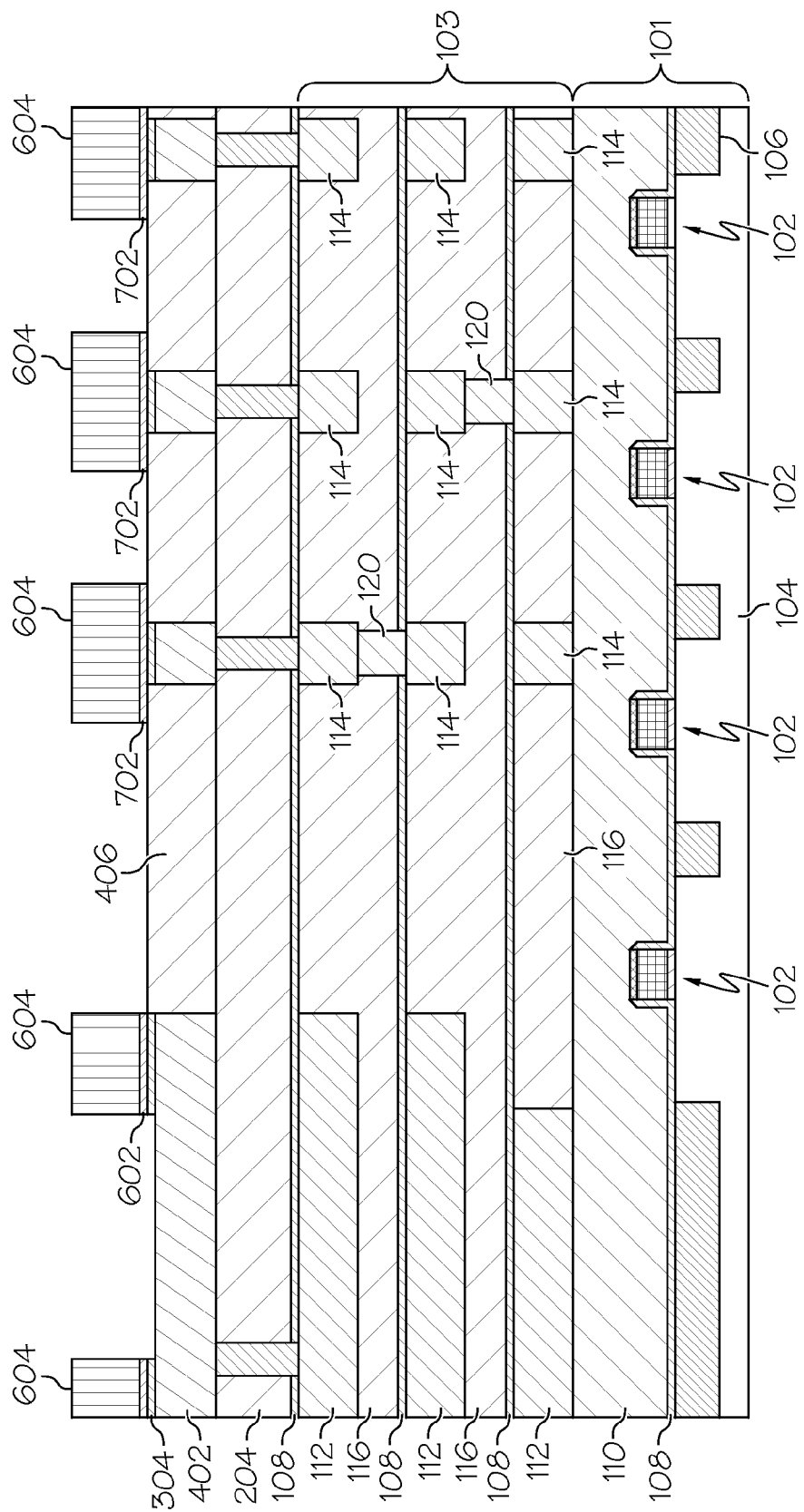

FIG. 7 illustrates the resultant structure following an etching process such as, for example, a chemical etching process that removes the exposed portions of the capping layer 304 and the second capping layer 602. In this regard, the etching process exposes a portion of the conductive pad region 402 and the dielectric layer 406 and defines pads 702 (formed from the second capping layer 602).

Figure 8:
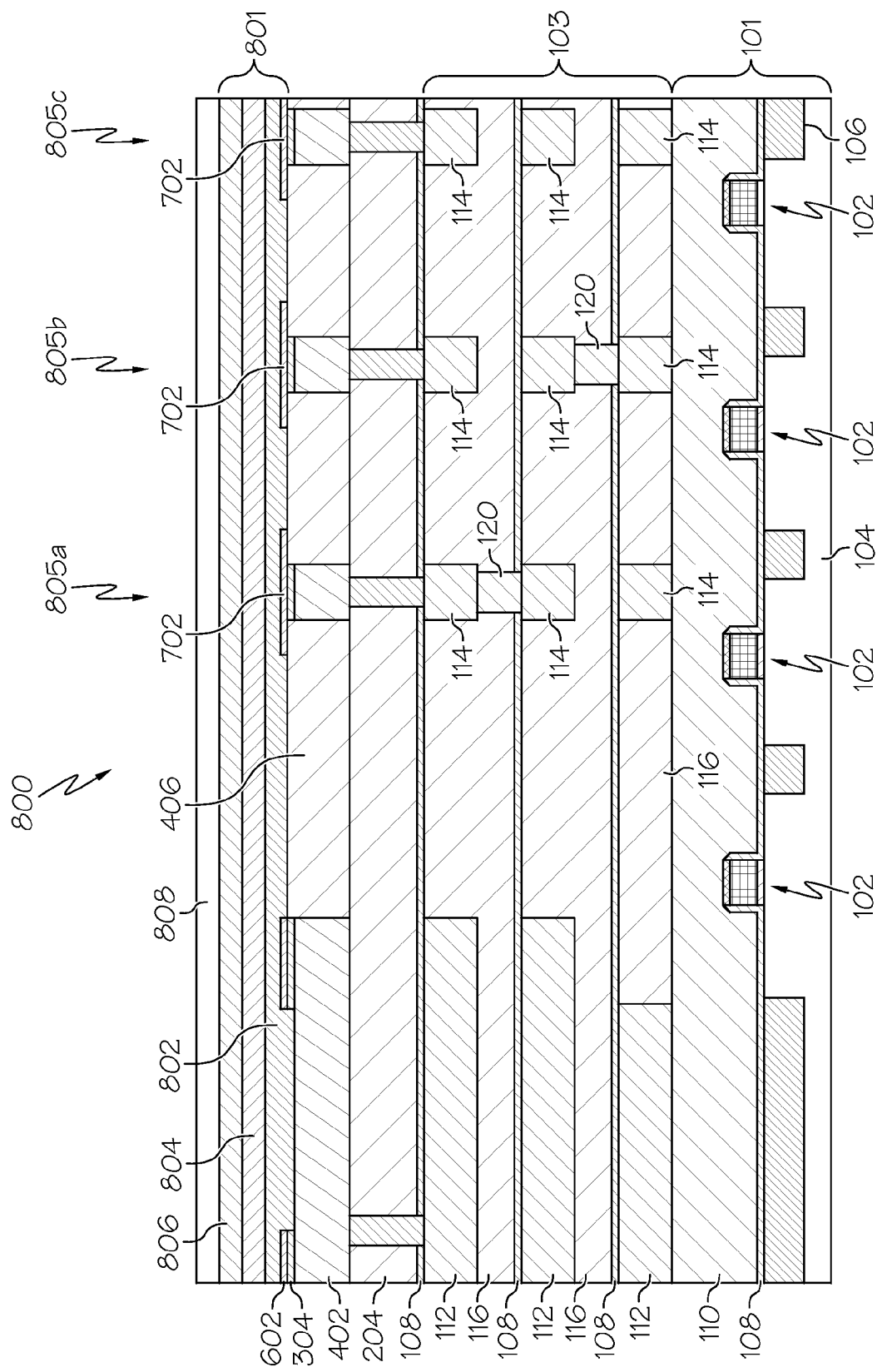

FIG. 8 illustrates the resultant structure following the removal of the photoresist 604 and the formation of a radiation absorbing device 801 that is operative to absorb radiation such as, for example, visible light. The radiation absorbing device 801 is formed from doped amorphous silicon layers that may be formed by, for example, by sputter deposition or CVD process. In this regard, the radiation absorbing device 801 includes an n-type layer 802 (e.g., an n-type doped silicon material), an intermediary layer 804 that may include, for example, an intrinsic (or nearly intrinsic) silicon material and a p-type layer 806 (e.g., a p-type doped silicon material) that form a diode structure. A transparent conductive layer 808, such as, for example, a transparent conducting oxide material such as a tin oxide material or zinc oxide material may be formed over the p-type layer 806. The resultant structure includes a device 800 that includes pixels 805a, 805b and 805c that are partially defined by the pads 702. Though the illustrated embodiment illustrates the formation and resultant structure of a few pixels 805 alternate embodiments may include the formation of any number of pixels similar to the pixels 805.

Figure 9:
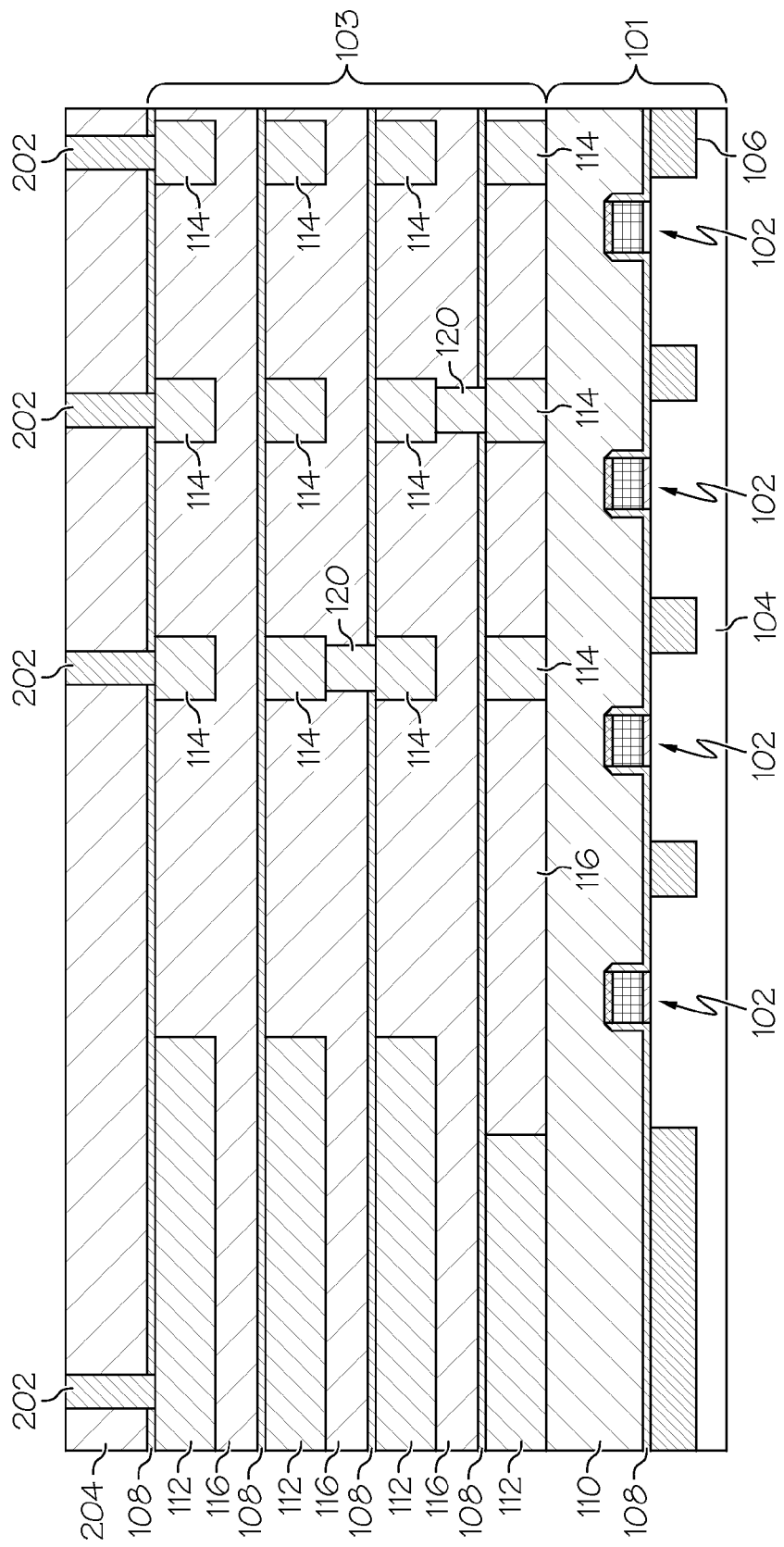

FIGS. 9-12 illustrate an alternate exemplary method and resultant structure for forming a POAP device. Referring to FIG. 9, an active device region 101 and an interconnect portion 103 including vias 202; and a dielectric layer 204 are formed in a similar manner as discussed above.

Figure 10:
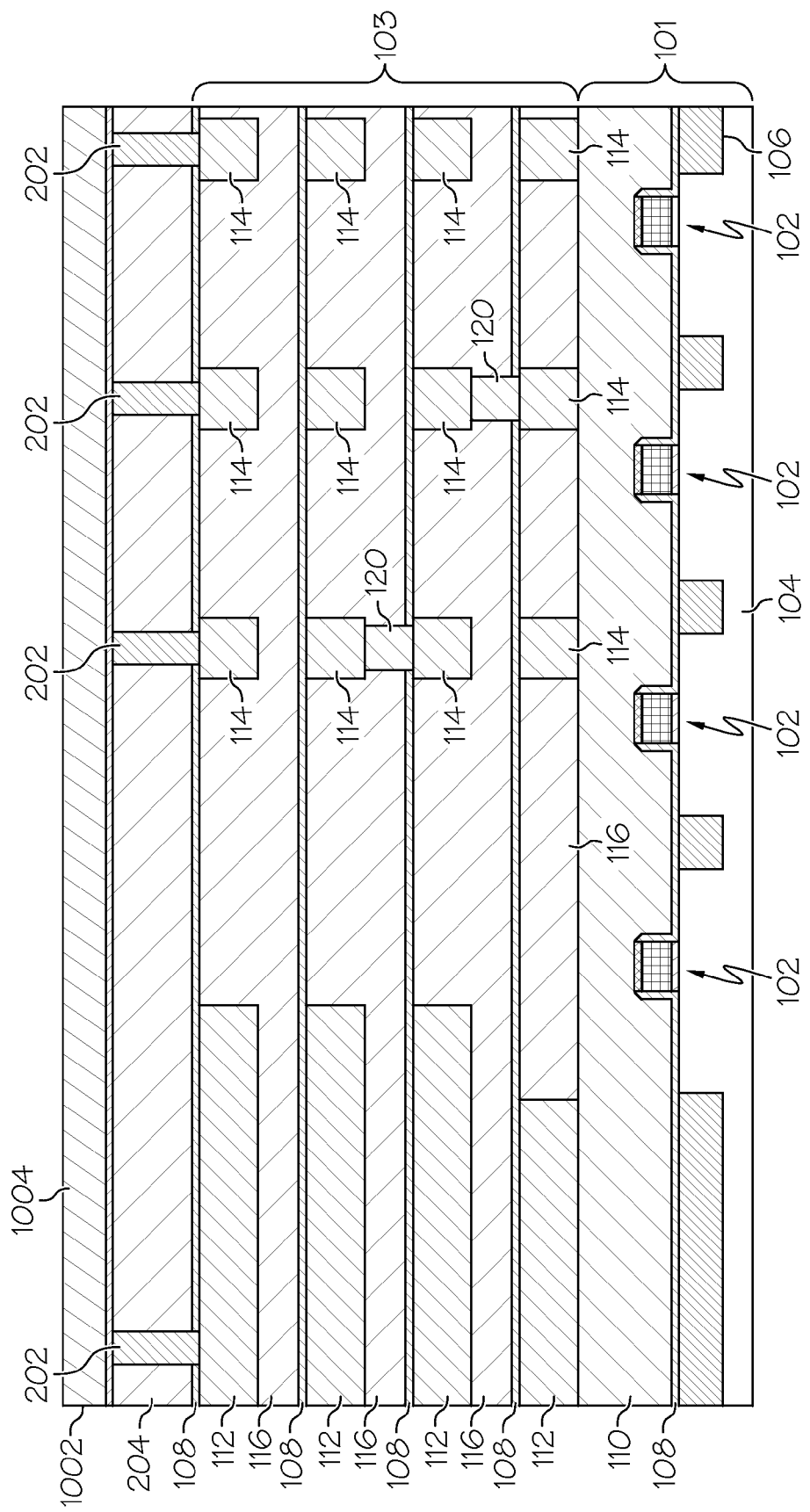

FIG. 10 illustrates the formation of a capping layer 1002 that is deposited over the vias 202 and the dielectric layer 204 that includes a nitride material such as, for example, titanium nitride and conductive metallic layer 1004 that includes a conductive metal material such as, for example, aluminum.

Figure 11:
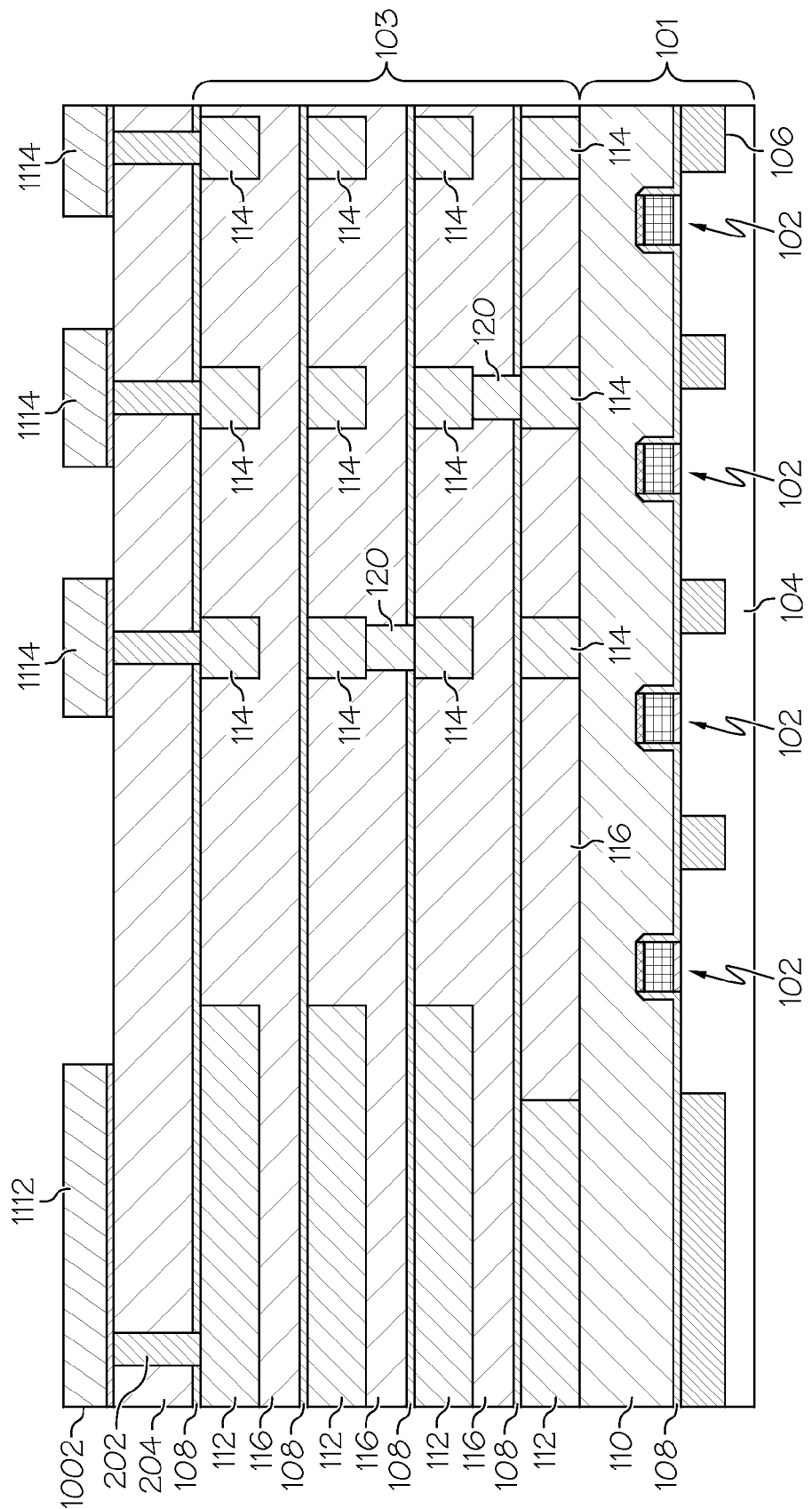

FIG. 11 illustrates the resultant structure following a photolithographic patterning an etching process that removes exposed portions of the capping layer 1002 and conductive metallic layer 1004 to expose portions of the dielectric layer 204 and define a conductive pad 1112 and conductive interconnects 1114.

Figure 12:
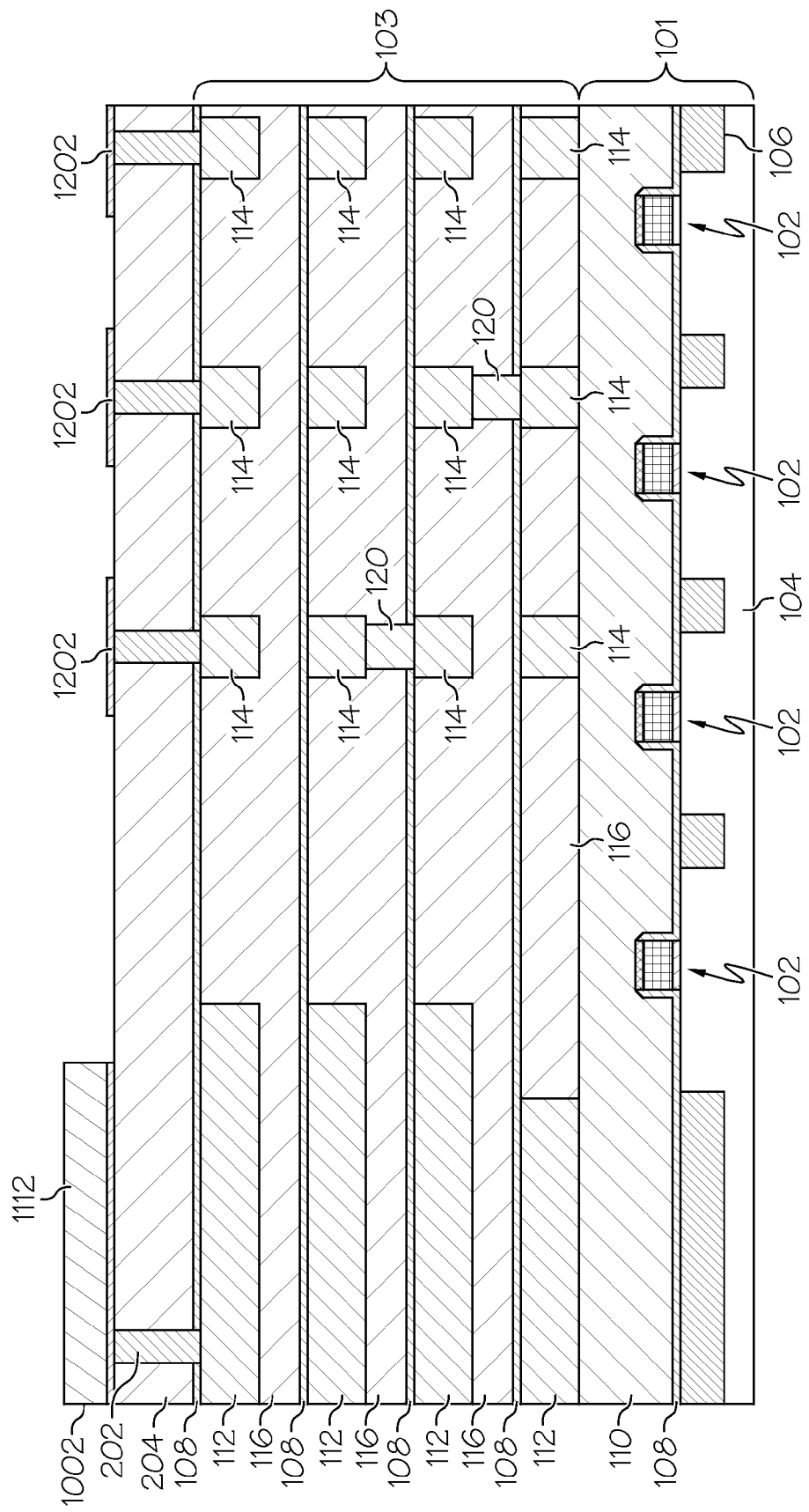

FIG. 12 illustrates the resultant structure following the selective etching of the Al layer in the array that removes the conductive interconnects 1114 and exposes TiN pads 1202 over the vias.

Figure 13:
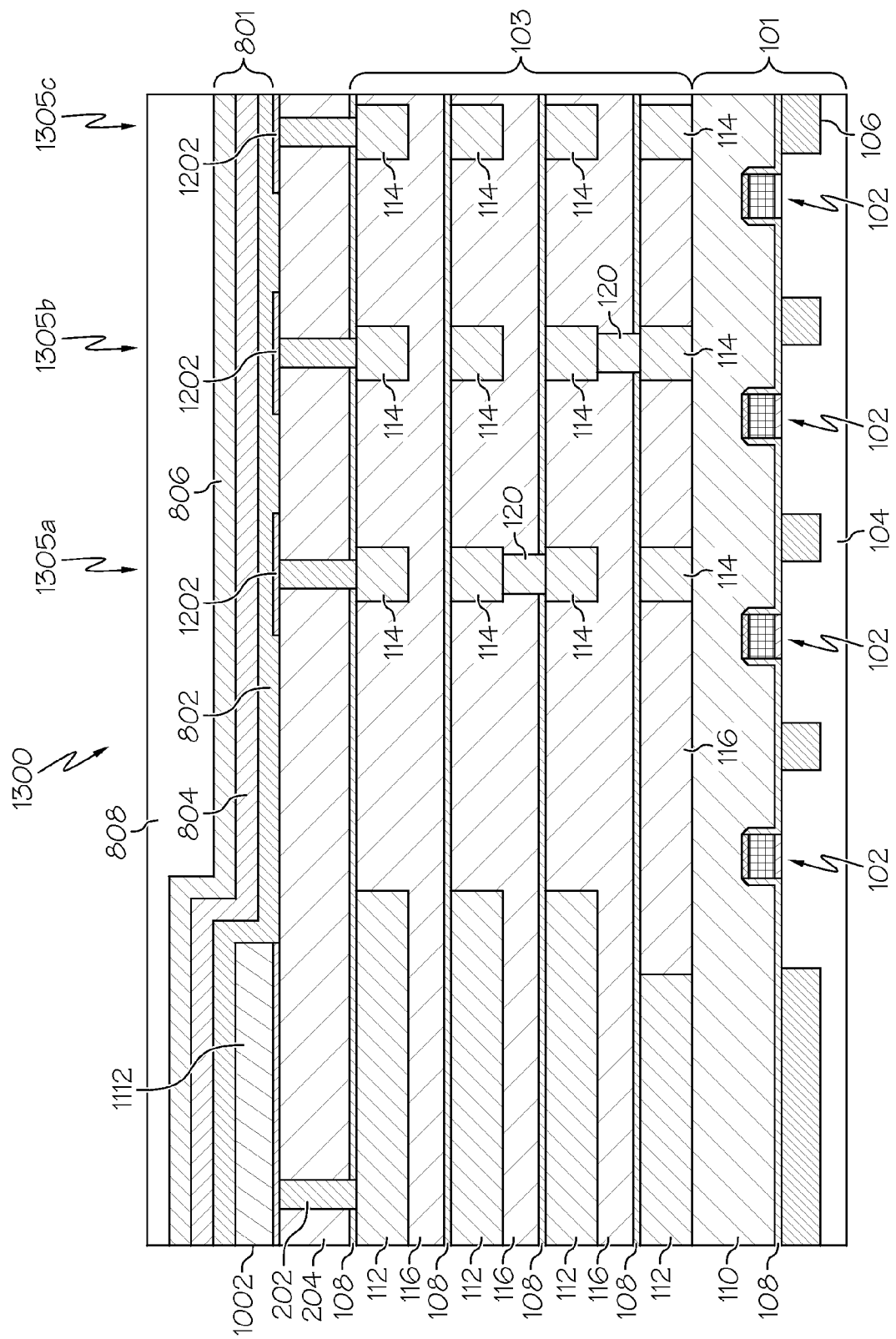
FIG. 13 illustrates the resultant structure following formation of a radiation absorbing device.

FIG. 13 illustrates the resultant structure following formation of a radiation absorbing device 801 in a similar manner as discussed above in FIG. 8 that includes an n-type layer 802 (e.g., an n-type doped silicon material), an intrinsic (nearly intrinsic) silicon layer 804 and a p-type layer 806 (e.g., a p-type doped silicon material) that form a diode structure. A transparent conductive layer 808 may be formed over the p-type layer 806. The resultant structure includes a device 1300 that includes pixels 1305a, 1305b and 1305c.

Figure 14:
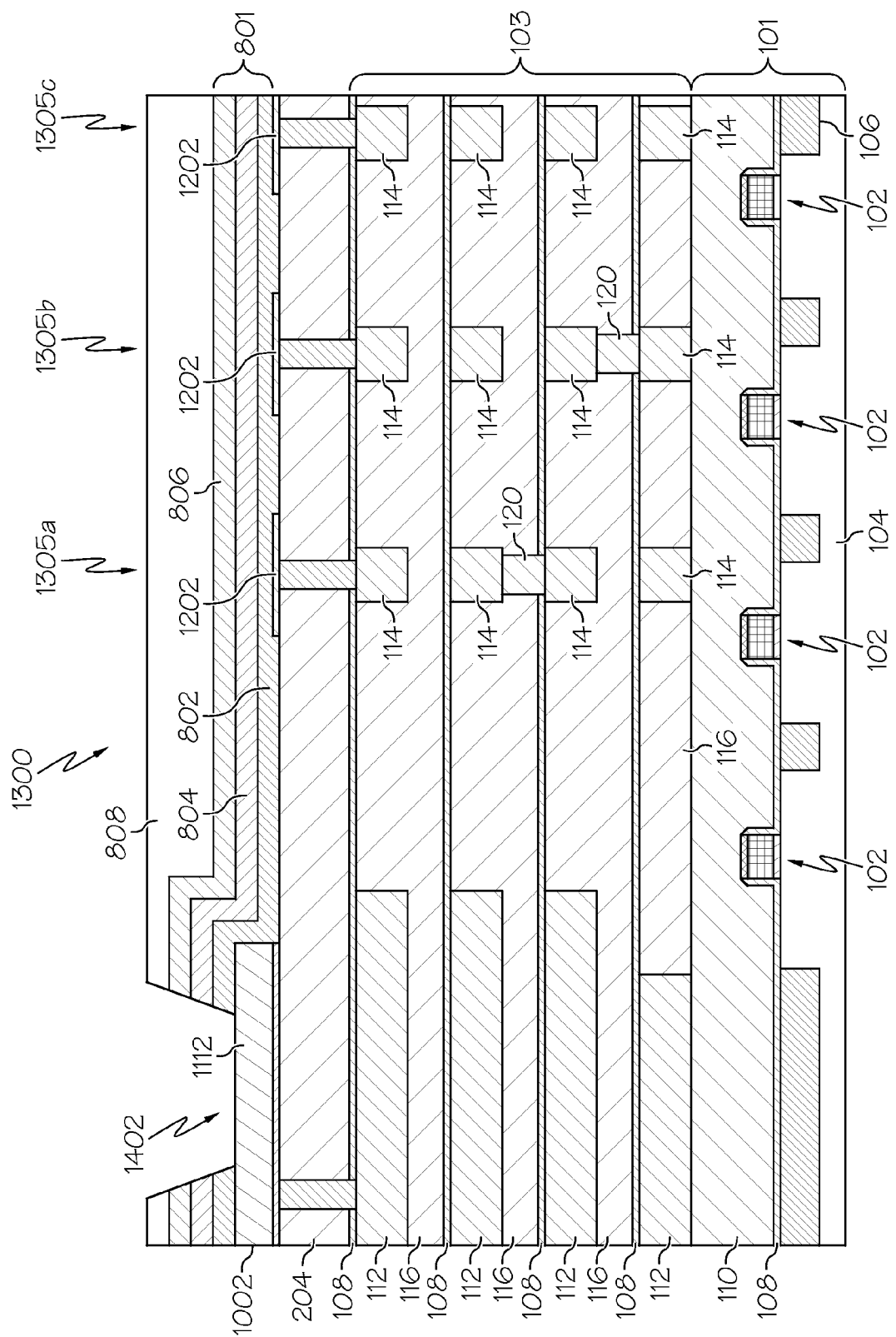
FIG. 14 illustrates the resultant structure following formation of a via.

FIG. 14 illustrates a via 1402 that is formed over the bond pad to allow connection to the package. The via 1402 is formed by a patterning and etching process that removes portions of the n-type layer 802, the intrinsic layer 804, and the p-type layer 806 to expose the a portion of the conductive pad 1112.

Figure 15:
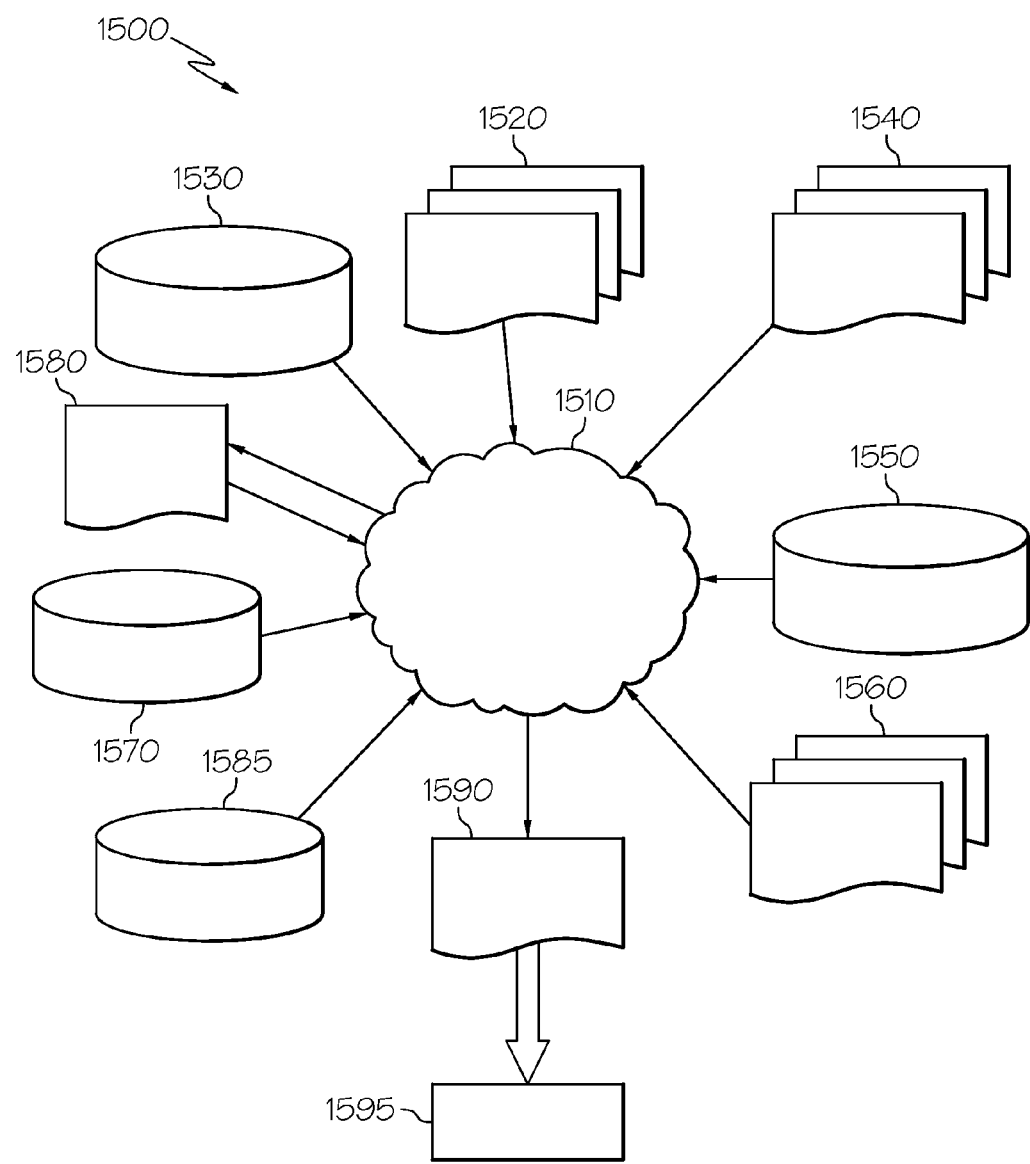
FIG. 15 illustrates a flow diagram of a design process used in semiconductor design, manufacture, and/or tests.

FIG. 15 shows a block diagram of an exemplary design flow 1500 used for example, in semiconductor IC logic design, simulation, test, layout, and manufacture. Design flow 1500 includes processes, machines and/or mechanisms for processing design structures or devices to generate logically or otherwise functionally equivalent representations of the design structures and/or devices described above and shown in FIGS. 8 and 12. The design structures processed and/or generated by design flow 1500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1500 may vary depending on the type of representation being designed. For example, a design flow 1500 for building an application specific IC (ASIC) may differ from a design flow 1500 for designing a standard component or from a design flow 1500 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 1520 that is preferably processed by a design process 1510. Design structure 1520 may be a logical simulation design structure generated and processed by design process 1510 to produce a logically equivalent functional representation of a hardware device. Design structure 1520 may also or alternatively comprise data and/or program instructions that when processed by design process 1510, generate a functional representation of the physical structure of a hardware device. Whether representing functional and/or structural design features, design structure 1520 may be generated using electronic computer-aided design (ECAD) such as implemented by a core developer/designer.

When encoded on a machine-readable data transmission, gate array, or storage medium, design structure 1520 may be accessed and processed by one or more hardware and/or software modules within design process 1510 to simulate or otherwise functionally represent an electronic component, circuit, electronic or logic module, apparatus, device, or system such as those shown in FIGS. 8 and 12. As such, design structure 1520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1510 preferably employs and incorporates hardware and/or software modules for synthesizing, translating, or otherwise processing a design/simulation functional equivalent of the components, circuits, devices, or logic structures shown in FIGS. 8 and 12 to generate a Netlist 1580 which may contain design structures such as design structure 1520. Netlist 1580 may comprise, for example, compiled or otherwise processed data structures representing a list of wires, discrete components, logic gates, control circuits, I/O devices, models, etc. that describes the connections to other elements and circuits in an integrated circuit design. Netlist 1580 may be synthesized using an iterative process in which netlist 1580 is resynthesized one or more times depending on design specifications and parameters for the device. As with other design structure types described herein, netlist 1580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1510 may include hardware and software modules for processing a variety of input data structure types including Netlist 1580. Such data structure types may reside, for example, within library elements 1530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1540, characterization data 1550, verification data 1560, design rules 1570, and test data files 1585 which may include input test patterns, output test results, and other testing information. Design process 1510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1510 without deviating from the scope and spirit of the invention. Design process 1510 may also include modules for performing standard circuit design processes such as timing analysis, verification, design rule checking, place and route operations, etc.

Design process 1510 employs and incorporates logic and physical design tools such as HDL compilers and simulation model build tools to process design structure 1520 together with some or all of the depicted supporting data structures along with any additional mechanical design or data (if applicable), to generate a second design structure 1590. Design structure 1590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1520, design structure 1590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 8 and 12. In one embodiment, design structure 1590 may comprise a compiled, executable HDL simulation model that functionally simulates the devices shown in FIGS. 8 and 12

Design structure 1590 may also employ a data format used for the exchange of layout data of integrated circuits and/or symbolic data format (e.g. information stored in a GDSII (GDS2), GL1, OASIS, map files, or any other suitable format for storing such design data structures). Design structure 1590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 8 and 12. Design structure 1590 may then proceed to a stage 1595 where, for example, design structure 1590: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a photoconductor-on-active pixel device, the method comprising:
    depositing a conductive layer on a first dielectric layer;
    depositing a first capping layer on the conductive layer;
    removing portions of the conductive layer and the first capping layer to define a first conductive pad portion and a first interconnect portion, and expose portions of the first dielectric layer;
    depositing a second dielectric layer on the exposed portions of the first dielectric layer;
    selectively etching the second dielectric layer with respect to the first capping layer thereby stopping on the first capping layer such that an upper surface of the second dielectric layer is flush with an upper surface of remaining portions of the first capping layer;
    depositing a second capping layer on the first capping layer and the second dielectric layer;
    removing portions of the second capping layer to expose portions of the second dielectric layer and removing portions of the second capping layer and first capping layer to expose a portion of the first conductive pad portion; and
    forming radiation absorbing layers on the exposed portions of the second dielectric layer, the exposed portion of the first conductive pad portion, and the second capping layer.

2. The method of claim 1, wherein prior to depositing the conductive layer on the first dielectric layer the method includes:
    forming a field effect transistor device on a substrate;
    forming an interconnect layer over the field effect transistor device, the interconnect layer including a second conductive pad portion and a second interconnect portion disposed in a third dielectric layer; and
    forming a first conductive via and a second conductive via in the third dielectric layer, the first conductive via contacting the first conductive pad portion and the second conductive pad portion and the second conductive via contacting the first interconnect portion and the second interconnect portion.

3. The method of claim 1, wherein the forming the radiation absorbing layers includes:
    forming an n-type doped layer;
    forming an intrinsic layer on the n-type doped layer; and
    forming a p-type doped layer on the intrinsic layer.

4. The method of claim 1, wherein the method includes forming a conductive transparent layer over the radiation absorbing layers.

5. The method of claim 3, wherein the radiation absorbing layers are formed by an epitaxial silicon growth process.

6. The method of claim 1, wherein the conductive layer includes aluminum.

7. The method of claim 2, wherein the conductive vias include tungsten.

8. The method of claim 2, wherein the second conductive pad portion and the second interconnect portion include copper.

9. The method of claim 1, wherein the first capping layer and the second capping layer include a nitride material.

10. A method for fabricating a photoconductor-on-active pixel device, the method comprising:
depositing a conductive layer on a first dielectric layer and on, and in contact with conductive vias;
depositing a first capping layer on the conductive layer;
removing portions of the conductive layer and the first capping layer to define a first conductive pad portion and a first interconnect portion, and expose portions of the first dielectric layer;
depositing a second dielectric layer on the exposed portions of the first dielectric layer;
selectively etching the second dielectric layer with respect to the first capping layer thereby stopping on the first capping layer such that an upper surface of the second dielectric layer is flush with an upper surface of remaining portions of the first capping layer;
depositing a second capping layer on the first capping layer and the second dielectric layer;
removing portions of the second capping layer to expose portions of the second dielectric layer and removing portions of the second capping layer and first capping layer to expose a portion of the first conductive pad portion; and
forming radiation absorbing layers on the exposed portions of the second dielectric layer, the exposed portion of the first conductive pad portion, and the second capping layer.

11. The method of claim 10, wherein prior to depositing the conductive layer on the first dielectric layer the method includes:
forming a field effect transistor device on a substrate;
forming an interconnect layer over the field effect transistor device, the interconnect layer including a second conductive pad portion and a second interconnect portion disposed in a third dielectric layer; and
forming a first conductive via and a second conductive via in the third dielectric layer, the first conductive via contacting the first conductive pad portion and the second conductive pad portion and the second conductive via contacting the first interconnect portion and the second interconnect portion.

12. The method of claim 10, wherein the forming the radiation absorbing layers includes:
forming an n-type doped layer;
forming an intrinsic layer on the n-type doped layer; and
forming a p-type doped layer on the intrinsic layer.

13. The method of claim 10, wherein the method includes forming a conductive transparent layer over the radiation absorbing layers.

14. The method of claim 12, wherein the radiation absorbing layers are formed by an epitaxial silicon growth process.

15. The method of claim 10, wherein the conductive layer includes aluminum.

16. The method of claim 11, wherein the conductive vias include tungsten.

17. The method of claim 11, wherein the second conductive pad portion and the second interconnect portion include copper.

18. The method of claim 10, wherein the first capping layer and the second capping layer include a nitride material.

* * * * *